United States Patent
Bitsch et al.

(10) Patent No.: US 8,421,639 B2
(45) Date of Patent: Apr. 16, 2013

(54) BRANCH CURRENT MONITOR WITH AN ALARM

(75) Inventors: Michael Bitsch, Hillsboro, OR (US); Marc Bowman, McMinnville, OR (US)

(73) Assignee: Veris Industries, LLC, Tualatin, OR (US)

( * ) Notice: Subject to any disclaimer, the term of this patent is extended or adjusted under 35 U.S.C. 154(b) by 640 days.

(21) Appl. No.: 12/592,187

(22) Filed: Nov. 20, 2009

(65) Prior Publication Data

US 2010/0176960 A1    Jul. 15, 2010

Related U.S. Application Data

(60) Provisional application No. 61/199,911, filed on Nov. 21, 2008.

(51) Int. Cl.
*G08B 21/00* (2006.01)
*G01R 31/28* (2006.01)
*G06F 11/00* (2006.01)

(52) U.S. Cl.
USPC ........... 340/664; 340/660; 340/661; 340/662; 340/663; 714/736

(58) Field of Classification Search .......... 340/660–664, 340/659, 870.09; 324/115, 117 R, 117 H, 324/126–127; 714/736; 702/120
See application file for complete search history.

(56) References Cited

U.S. PATENT DOCUMENTS

| | | |
|---|---|---|
| 1,100,171 A | 6/1914 | Brown |
| 1,455,263 A | 5/1923 | Oberfell |
| 1,569,723 A | 1/1926 | Dickinson |
| 1,800,474 A | 4/1931 | Scherer |
| 1,830,541 A | 11/1931 | Harris |
| 1,871,710 A | 8/1932 | Lenehan |
| 2,059,594 A | 11/1936 | Massa, Jr. |
| 2,412,782 A | 12/1946 | Palmer |
| 2,428,613 A | 10/1947 | Boyajian |
| 2,663,190 A | 12/1953 | Ilgenfritz |
| 2,746,295 A | 5/1956 | Lubkin |
| 2,802,182 A | 8/1957 | Godshalk et al. |
| 2,852,739 A | 9/1958 | Hansen |
| 2,943,488 A | 7/1960 | Strobel et al. |
| 3,190,122 A | 6/1965 | Edwards |
| 3,243,674 A | 3/1966 | Ebert |
| 3,287,974 A | 11/1966 | Ciemochowski |

(Continued)

FOREIGN PATENT DOCUMENTS

| | | |
|---|---|---|
| EP | 1531334 A2 | 5/2005 |
| JP | 5083776 | 4/1993 |

OTHER PUBLICATIONS

AT91M42800A Summary, "AT91 ARM Thumb Microcontrollers," Atmel, Feb. 2002.
Description of KT® 6300, 6400 Split-Core kW/kWH Transducers . . . Enercept KT®, Veris Industries, Inc., (date unavailable).

(Continued)

*Primary Examiner* — Daniel Wu
*Assistant Examiner* — Mohamed Barakat
(74) *Attorney, Agent, or Firm* — Chernoff Vilhauer McClung & Stenzel, LLP (57) ABSTRACT

A power meter for monitoring current in a power cable annunciates an alarm if the current transgresses one or more alarm current limits. False alarms are avoided by delaying the activation of the alarm for a delay interval following determination that current is flowing in the monitored conductor.

9 Claims, 5 Drawing Sheets

U.S. PATENT DOCUMENTS

| | | |
|---|---|---|
| 3,374,434 A | 3/1968 | Perry |
| 3,493,760 A | 2/1970 | Hoadley |
| 3,512,045 A | 5/1970 | Sanger et al. |
| 3,584,294 A | 6/1971 | Siwko |
| 3,593,078 A | 7/1971 | Domshy et al. |
| 3,696,288 A | 10/1972 | Carman |
| 3,728,705 A | 4/1973 | Atkins |
| 3,769,548 A | 10/1973 | Pardue |
| 3,772,625 A | 11/1973 | Raupach |
| 3,861,411 A | 1/1975 | Mitchell et al. |
| 3,955,701 A | 5/1976 | Fisch |
| 4,000,462 A * | 12/1976 | Boyd et al. ............ 324/127 |
| 4,001,647 A | 1/1977 | Klein et al. |
| 4,001,758 A | 1/1977 | Esper et al. |
| 4,030,058 A | 6/1977 | Riffe et al. |
| 4,048,605 A | 9/1977 | McCollum |
| 4,096,436 A | 6/1978 | Cook et al. |
| 4,107,519 A | 8/1978 | Bicek |
| D249,883 S | 10/1978 | Collins |
| 4,151,578 A | 4/1979 | Bell |
| 4,158,217 A | 6/1979 | Bell |
| 4,158,810 A | 6/1979 | Leskovar |
| 4,177,496 A | 12/1979 | Bell et al. |
| 4,198,595 A | 4/1980 | Milkovic |
| 4,207,604 A | 6/1980 | Bell |
| 4,215,278 A | 7/1980 | Barbier et al. |
| 4,227,419 A | 10/1980 | Park |
| 4,240,072 A * | 12/1980 | Fowler ............... 340/664 |
| 4,241,237 A | 12/1980 | Paraskevakos et al. |
| 4,249,264 A | 2/1981 | Crochet et al. |
| 4,250,449 A | 2/1981 | Shum |
| 4,253,336 A | 3/1981 | Pietzuch |
| 4,258,348 A | 3/1981 | Belfer et al. |
| 4,297,741 A | 10/1981 | Howell |
| 4,328,903 A | 5/1982 | Baars |
| 4,354,155 A | 10/1982 | Speidel et al. |
| 4,359,672 A | 11/1982 | Hart |
| 4,362,580 A | 12/1982 | Kane et al. |
| 4,363,061 A | 12/1982 | Vaerewyck et al. |
| 4,371,814 A | 2/1983 | Hannas |
| 4,373,392 A | 2/1983 | Nagamoto |
| 4,384,289 A | 5/1983 | Stillwell et al. |
| 4,386,280 A | 5/1983 | Ricaud et al. |
| 4,388,668 A | 6/1983 | Bell et al. |
| 4,393,714 A | 7/1983 | Schmidt |
| 4,398,426 A | 8/1983 | Park et al. |
| 4,408,175 A | 10/1983 | Nelson et al. |
| 4,413,193 A | 11/1983 | Crockett |
| 4,413,230 A | 11/1983 | Miller |
| 4,426,673 A | 1/1984 | Bell et al. |
| 4,432,238 A | 2/1984 | Tward |
| 4,491,790 A | 1/1985 | Miller |
| 4,492,919 A | 1/1985 | Milkovic |
| 4,495,463 A | 1/1985 | Milkovic |
| 4,506,199 A | 3/1985 | Asche |
| 4,558,310 A * | 12/1985 | McAllise .............. 340/661 |
| 4,558,595 A | 12/1985 | Kompelien |
| 4,574,266 A | 3/1986 | Valentine |
| 4,605,883 A | 8/1986 | Cockroft |
| 4,621,532 A | 11/1986 | Takagi et al. |
| 4,660,407 A | 4/1987 | Takami et al. |
| 4,709,339 A | 11/1987 | Fernandes |
| 4,739,229 A | 4/1988 | Heiler, Jr. |
| 4,746,809 A | 5/1988 | Coleman et al. |
| 4,754,365 A | 6/1988 | Kazahaya |
| 4,757,416 A | 7/1988 | Wilkerson |
| 4,758,774 A | 7/1988 | Crawford et al. |
| 4,758,962 A | 7/1988 | Fernandes |
| 4,783,748 A | 11/1988 | Swartzrauber et al. |
| 4,794,327 A | 12/1988 | Fernandes |
| 4,808,910 A | 2/1989 | Kessi |
| D301,331 S | 5/1989 | Rhodin |
| 4,851,803 A | 7/1989 | Hahn |
| 4,855,671 A | 8/1989 | Fernandes |
| 4,874,904 A | 10/1989 | DeSanti |
| 4,890,318 A | 12/1989 | Crane et al. |
| 4,926,105 A | 5/1990 | Mischenko et al. |
| 4,939,451 A | 7/1990 | Baran et al. |
| 4,944,187 A | 7/1990 | Frick et al. |
| 4,956,588 A | 9/1990 | Ming |
| 4,970,476 A | 11/1990 | Kitagawa |
| 4,972,167 A | 11/1990 | Fujioka |
| 4,992,709 A | 2/1991 | Griffin |
| 4,999,575 A | 3/1991 | Germer |
| 5,003,278 A | 3/1991 | May |
| 5,006,846 A | 4/1991 | Granville |
| 5,014,908 A | 5/1991 | Cox |
| 5,039,970 A | 8/1991 | Cox |
| 5,051,601 A | 9/1991 | Atobe et al. |
| 5,066,904 A | 11/1991 | Bullock |
| 5,079,510 A | 1/1992 | Komatsu et al. |
| D323,815 S | 2/1992 | Boutellier |
| 5,099,193 A | 3/1992 | Moseley et al. |
| 5,122,735 A | 6/1992 | Porter et al. |
| 5,148,348 A | 9/1992 | White |
| 5,181,026 A | 1/1993 | Granville |
| 5,196,784 A | 3/1993 | Estes, Jr. |
| D335,488 S | 5/1993 | Suzuki et al. |
| 5,223,790 A | 6/1993 | Baran et al. |
| 5,267,122 A | 11/1993 | Glover et al. |
| 5,296,819 A | 3/1994 | Kuroiwa et al. |
| 5,311,138 A | 5/1994 | Ott et al. |
| 5,317,274 A | 5/1994 | Nakagawa et al. |
| 5,323,256 A | 6/1994 | Banks |
| 5,337,206 A | 8/1994 | Kadah et al. |
| 5,365,462 A | 11/1994 | McBean |
| 5,377,128 A | 12/1994 | McBean |
| D354,945 S | 1/1995 | Dellavecchia et al. |
| 5,385,060 A | 1/1995 | Wang |
| 5,391,983 A | 2/1995 | Lusignan et al. |
| 5,397,970 A | 3/1995 | Rowlette et al. |
| 5,410,920 A | 5/1995 | Westwick |
| 5,426,360 A | 6/1995 | Maraio et al. |
| 5,430,438 A | 7/1995 | Joos et al. |
| 5,444,183 A | 8/1995 | Gehrs et al. |
| 5,450,765 A | 9/1995 | Stover |
| 5,467,012 A | 11/1995 | Nystrom |
| 5,471,359 A | 11/1995 | Simpson et al. |
| 5,473,234 A | 12/1995 | Richardson |
| 5,546,073 A * | 8/1996 | Duff et al. ............ 340/585 |
| 5,548,209 A | 8/1996 | Lusignan et al. |
| 5,563,506 A | 10/1996 | Fielden et al. |
| 5,572,073 A | 11/1996 | Burgess et al. |
| 5,578,927 A | 11/1996 | Perelle |
| 5,592,989 A | 1/1997 | Lynn et al. |
| 5,596,652 A | 1/1997 | Piatek et al. |
| 5,604,315 A | 2/1997 | Briefer et al. |
| 5,612,499 A | 3/1997 | Andrew et al. |
| 5,677,476 A | 10/1997 | McCarthy et al. |
| 5,705,989 A | 1/1998 | Cota et al. |
| 5,712,558 A | 1/1998 | Saint-Cyr et al. |
| 5,719,732 A * | 2/1998 | Nagahama et al. ........ 361/29 |
| 5,753,983 A | 5/1998 | Dickie et al. |
| 5,784,249 A | 7/1998 | Pouliot |
| 5,808,846 A | 9/1998 | Holce et al. |
| 5,844,138 A | 12/1998 | Cota |
| 5,861,683 A | 1/1999 | Engel et al. |
| 5,880,677 A | 3/1999 | Lestician |
| 5,880,918 A | 3/1999 | Horbelt et al. |
| 5,905,439 A | 5/1999 | Mcintyre |
| 5,909,087 A | 6/1999 | Bryde et al. |
| 5,920,190 A | 7/1999 | Peterson et al. |
| 5,920,191 A | 7/1999 | Maniero et al. |
| 5,922,939 A | 7/1999 | Cota |
| 5,994,892 A | 11/1999 | Turino et al. |
| 5,995,911 A | 11/1999 | Hart |
| D419,964 S | 2/2000 | Holce et al. |
| 6,020,702 A | 2/2000 | Farr |
| 6,029,524 A | 2/2000 | Klauder et al. |
| 6,044,430 A | 3/2000 | MacDonald |
| 6,046,550 A | 4/2000 | Ference et al. |
| 6,064,192 A | 5/2000 | Redmyer |
| 6,091,023 A | 7/2000 | O'Donnell |
| 6,122,972 A | 9/2000 | Crider |
| 6,124,791 A | 9/2000 | Wolf |
| D431,534 S | 10/2000 | Holce et al. |
| 6,133,709 A | 10/2000 | Puchianu |

| | | |
|---|---|---|
| 6,133,723 A | 10/2000 | Feight |
| 6,137,418 A | 10/2000 | Zuercher et al. |
| 6,146,109 A | 11/2000 | Davis et al. |
| 6,236,949 B1 | 5/2001 | Hart |
| 6,269,317 B1 | 7/2001 | Schachner et al. |
| 6,308,140 B1 | 10/2001 | Dowling et al. |
| 6,330,516 B1 | 12/2001 | Kammeter |
| 6,331,821 B1 | 12/2001 | Holce et al. |
| 6,344,951 B1 | 2/2002 | Sato et al. |
| 6,351,206 B1 | 2/2002 | Schweiger et al. |
| 6,373,238 B2 | 4/2002 | Lewis et al. |
| 6,377,430 B2 | 4/2002 | Holce et al. |
| 6,380,696 B1 | 4/2002 | Sembhi et al. |
| 6,384,946 B1 | 5/2002 | Pitsch et al. |
| 6,404,166 B1 | 6/2002 | Puchianu |
| 6,414,241 B1 | 7/2002 | O'Donnell |
| D466,078 S | 11/2002 | Bowman |
| 6,496,378 B2 | 12/2002 | Holce et al. |
| 6,504,357 B1 | 1/2003 | Hemminger et al. |
| 6,504,695 B1 | 1/2003 | Holce et al. |
| 6,549,859 B1 | 4/2003 | Ward |
| 6,591,482 B1 | 7/2003 | Fleege et al. |
| D478,313 S | 8/2003 | Bowman |
| 6,615,147 B1 | 9/2003 | Jonker et al. |
| 6,636,028 B2 | 10/2003 | Lavoie et al. |
| 6,650,245 B2 * | 11/2003 | Chung .................. 340/648 |
| 6,657,424 B1 | 12/2003 | Voisine et al. |
| 6,737,854 B2 | 5/2004 | Bruno et al. |
| 6,756,776 B2 | 6/2004 | Perkinson et al. |
| 6,774,803 B1 | 8/2004 | Tiffin |
| 6,809,509 B2 | 10/2004 | Bruno et al. |
| 6,815,942 B2 | 11/2004 | Randall et al. |
| 6,822,576 B1 * | 11/2004 | Feight et al. .................. 340/664 |
| 6,825,771 B2 | 11/2004 | Bruno et al. |
| 6,856,515 B2 | 2/2005 | Holce et al. |
| 6,861,683 B2 | 3/2005 | Rissing et al. |
| 6,871,827 B2 | 3/2005 | Petak et al. |
| 6,879,260 B1 * | 4/2005 | Olofsson et al. .............. 340/648 |
| 6,888,712 B2 | 5/2005 | Holce et al. |
| 6,889,271 B1 | 5/2005 | Germer et al. |
| 6,937,003 B2 | 8/2005 | Bowman et al. |
| 6,950,292 B2 | 9/2005 | Holce et al. |
| 6,988,043 B1 | 1/2006 | Randall |
| 7,006,934 B2 | 2/2006 | Jonker et al. |
| 7,053,497 B2 | 5/2006 | Sodemann et al. |
| 7,106,048 B1 * | 9/2006 | Feight et al. .................. 324/127 |
| 7,157,899 B2 | 1/2007 | Bruno |
| 7,161,345 B2 | 1/2007 | Bruno |
| 7,193,428 B1 | 3/2007 | Baron et al. |
| 7,208,909 B2 * | 4/2007 | Simon ..................... 318/778 |
| 7,212,930 B2 | 5/2007 | Bruno |
| 7,221,145 B2 | 5/2007 | Bowman et al. |
| 7,230,414 B2 | 6/2007 | Bruno |
| 7,239,810 B2 | 7/2007 | Seely et al. |
| 7,274,187 B2 | 9/2007 | Loy |
| 7,282,889 B2 | 10/2007 | Freed et al. |
| 7,310,049 B2 | 12/2007 | Bowman |
| 7,312,686 B2 | 12/2007 | Bruno |
| 7,330,022 B2 | 2/2008 | Bowman et al. |
| 7,333,345 B2 | 2/2008 | Holce et al. |
| 7,352,287 B2 | 4/2008 | Rupert |
| 7,359,809 B2 | 4/2008 | Bruno |
| 7,447,603 B2 | 11/2008 | Bruno |
| 7,791,297 B2 * | 9/2010 | Mueller et al. ................. 318/434 |
| 7,855,655 B2 * | 12/2010 | Hunter et al. ................. 340/664 |
| 2004/0227503 A1 | 11/2004 | Bowman et al. |
| 2005/0240362 A1 | 10/2005 | Randall |
| 2006/0085144 A1 | 4/2006 | Slota et al. |
| 2006/0103548 A1 | 5/2006 | Borkowski et al. |
| 2006/0161827 A1 * | 7/2006 | Gohel et al. .................. 714/736 |
| 2006/0164096 A1 | 7/2006 | Kwon |
| 2006/0181242 A1 | 8/2006 | Freed et al. |
| 2009/0115400 A1 | 5/2009 | Hunter |
| 2009/0115620 A1 | 5/2009 | Hunter et al. |
| 2009/0295370 A1 | 12/2009 | Parker et al. |

OTHER PUBLICATIONS

Ganssie, "Interrupt Latency," Oct. 1, 2001, [online], [retrieved on Aug. 26, 2004], Retrieved from the Embedded.com website using the Internet, <URL: http://www.embedded.com/showArticle.jhtml?articleID=9900320 >.

* cited by examiner

BRANCH CURRENT MONITOR WITH AN ALARM

CROSS-REFERENCE TO RELATED APPLICATIONS

This application claims priority to U.S. Provisional App. No. 61/199,911, filed Nov. 21, 2008.

BACKGROUND OF THE INVENTION

The present invention relates to a current monitoring system and, more particularly, to a current meter having an errant current alarm.

The total power consumption of a building or other facility is monitored by the electric utility with a power meter located between the utility's distribution transformer and the facility's power distribution panel. However, in many instances it is desirable to sub-meter or attribute the facility's power usage and cost to different occupancies, buildings, departments, or cost centers within the facility or to monitor the power consumption of individual loads or groups of loads, such as motors, lighting, heating units, cooling units, machinery, etc. These single phase or multi-phase electrical loads are typically connected to one or more of the branch circuits that extend from the facility's power distribution panel. While a power meter may be installed at any location between a load and the distribution panel, typically a power meter capable of monitoring a plurality of circuits is installed proximate the power distribution panel to provide centralized monitoring of the various loads powered from the panel.

Flexibility has favored adoption of digital power meters incorporating data processing systems that can monitor a plurality of circuits and determine a number of parameters related to electricity consumption. A digital power meter for measuring electricity consumption by respective branch circuits comprises a plurality of voltage and current transducers that are periodically read by the meter's data processing unit which, in a typical digital power meter, comprises one or more microprocessors or digital signal processors (DSP). The data processing unit periodically reads and stores the outputs of the transducers quantifying the magnitudes of current and voltage samples and, using that data, calculates the current, voltage, power, and other electrical parameters, such as real or active power, apparent power and reactive power, that quantify electricity distribution and consumption. The calculated parameters are typically output to a display for immediate viewing or transmitted from the meter's communications interface to another data processing system, such as a building management computer for remote display or further processing, for example formulating instructions to automated building equipment.

The voltage transducers of digital power meters commonly comprise a voltage divider network that is connected to a conductor in which the voltage will be measured. The power distribution panel provides a convenient location for connecting the voltage transducers because typically each phase of the power is delivered to the power distribution panel on a separate bus bar and the voltage and phase is the same for all loads attached to the respective bus bar. Interconnection of a voltage transducer and the facility's wiring is facilitated by wiring connections in the power distribution panel, however, the voltage transducer(s) can be interconnected anywhere in the wiring that connects the supply and a load, including at the load's terminals.

The current transducers of digital power meters typically comprise current transformers that encircle the respective power cables that connect each branch circuit to the bus bar(s) of the distribution panel. A current transformer typically comprises multiple turns of wire wrapped around the cross-section of a toroidal core. The power cable conducting the load current is passed through the aperture in the center of the toroidal core and constitutes the primary winding of the transformer and the wire wrapped around the cross-section of the core comprises the secondary winding of the transformer. Current flowing in the primary winding (primary current) induces a secondary voltage and current in the secondary winding which is quantitatively related to the current in the primary winding. The secondary winding is typically connected to a resistor network and the magnitude of the primary current can be determined from the amplitude of the voltage at the output of the resistor network. To measure the power consumed by a plurality of loads making up a facility, a current transformer must be installed encircling each conductor in which the current will be measured. Bowman et al., U.S. Pat. No. 6,937,003 B2, discloses a power monitoring system that includes a plurality of current transformers mounted on a common support facilitating installation of a power meter in an electrical distribution panel.

A digital power meter facilitates monitoring several circuits for unexpected or abnormal conditions. A digital power meter can monitor current and voltage in each of a plurality of circuits and the meter can be programmed to issue an alarm responsive to different conditions in each circuit. While digital meters are typically precise, they rely on data obtained by repetitive sampling of transducer outputs that are quantitatively representative of the voltage and current in the monitored circuits. In many circuits the voltage and current fluctuate significantly as loads are actuated or as loading conditions change. This fluctuation can produce momentary, transient, high and low current spikes which can occur coincidentally with the reading of a sample and produce false alarms, reducing the effectiveness of the alarm system.

What is desired, therefore, is a reliable alarm for monitoring current in the ones of a plurality of branch circuits.

DETAILED DESCRIPTION OF PREFERRED EMBODIMENTS

Figure 1:
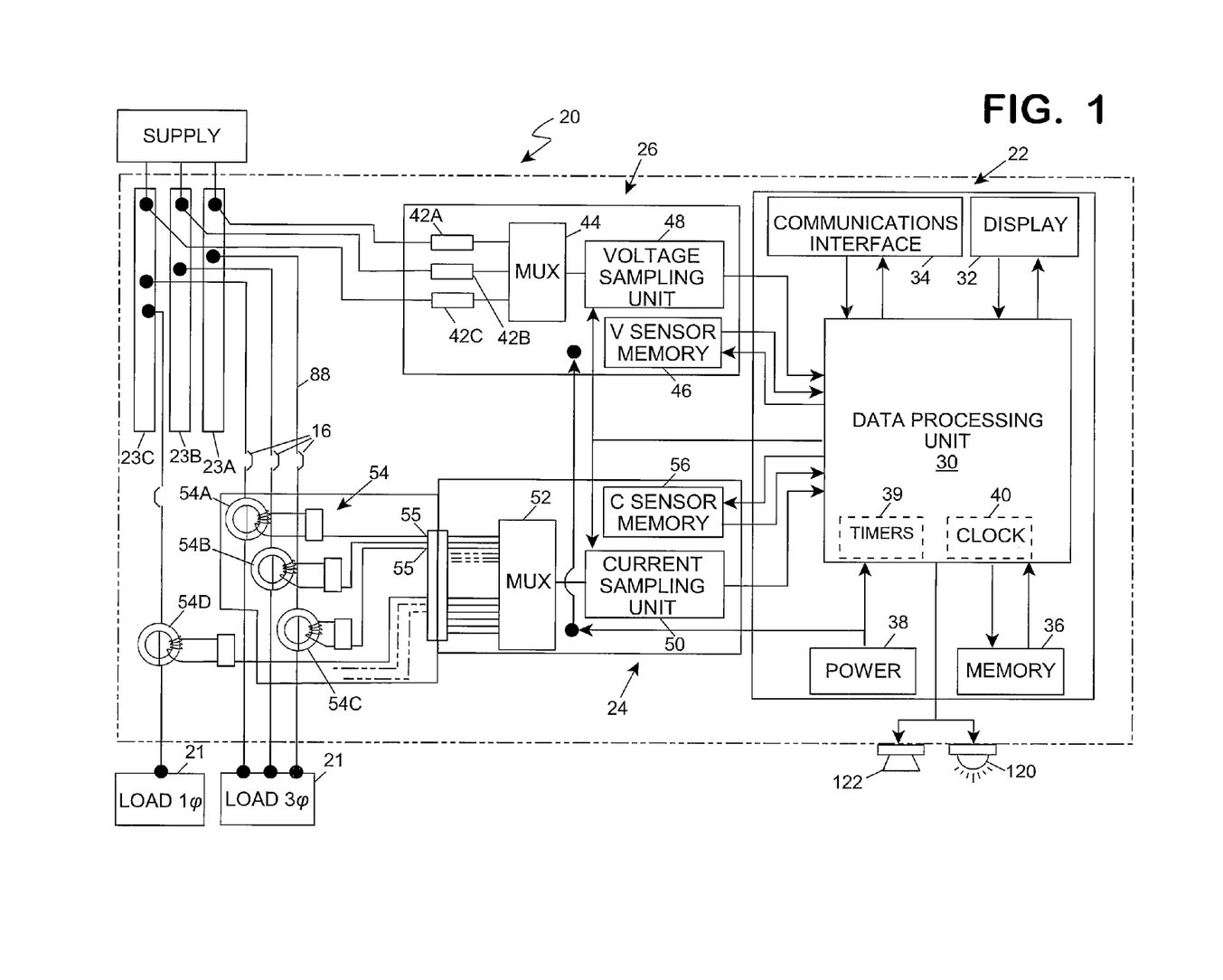
FIG. 1 is a schematic diagram of a digital power meter.

Referring in detail to the drawings where similar parts are identified by like reference numerals, and, more particularly to FIG. 1, a digital power meter 20 arranged to monitor the voltage and current in a plurality of branch circuits comprises, generally, a data processing module 22, a current module 24 and a voltage module 26. The data processing module 22 comprises a data processing unit 30 which, typically, comprises at least one microprocessor or digital signal processor (DSP). The data processing unit 30 reads and stores data received periodically from the voltage module and the current module, and uses that data to calculate the current, voltage, power and other electrical parameters that are the meter's output. The calculated values may be output to a display 32 for viewing at the meter or output to a communications interface 34 for transmission to another data processing system, such as a building management computer, for remote display or use in automating or managing facility functions. The data processing module may also include a memory 36 in which the software for the data processing unit and the data manipulated by the data processing unit may be stored. In addition, the data processing module may include a power supply 38 to provide power to the data processing unit and to the voltage and current modules and one or more timers 39 to measure intervals between the occurrences of events.

The voltage module 26 includes one or more voltage transducers 42 each typically comprising a resistor network, a voltage sampling unit 48 to sample the output of the voltage transducers and covert the analog measurements to digital data suitable for use by the data processing unit and a multiplexer 44 that periodically connects the voltage sampling unit to selected ones of the voltage transducers enabling periodic sampling of the magnitude of the voltage. Typically, each phase of the electricity supplied to a distribution panel is connected to a bus bar 23 to which are connected the circuit breakers 16 that provide a conductive interconnection to each of the respective loads 21. Since the voltage and phase supplied to all commonly connected loads is the same, a meter for measuring three-phase power typically includes three voltage transducers 42A, 42B, 42C each connected to a respective bus bar 23A, 23B, 23C. The voltage module also includes a voltage sensor memory 46 in which voltage sensor characterization data, including relevant specifications and error correction data for the voltage transducers are stored. If a portion of the voltage module requires replacement, a new voltage module comprising a voltage sensor memory containing sensor characterization data for the sensors of the new module can be connected to the data processing unit. The data processing unit reads the data contained in the voltage sensor memory and applies the sensor characterization data when calculating the voltage from the output data of the replacement voltage module.

The current module 24 typically comprises a current sampling unit 50, a multiplexer 52 and a plurality of current transducers 54 communicatively connected to respective sensor positions 55 of the current module. The multiplexer 52 sequentially connects the sampling unit to the respective sensor positions enabling the sampling unit to periodically sample the output of each of the current transducers 54. The current sampling unit comprises an analog-to-digital converter to convert the analog sample at the output of a current transducer selected by the multiplexer, to a digital signal for acquisition by the data processing unit. A clock 40, which may be included in the data processing unit, provides a periodic timing signal to the data processing unit which outputs a sampling signal to trigger sampling of the transducer output by the current sampling unit. The current module also includes a current sensor memory 56 in which are stored characterization data for the current transducers comprising the module. The characterization data may include transducer identities; relevant specifications, such as turns ratio; and error correction factors, for example to correct for magnetization induced errors. The characterization data may also include the type of transducers, the number of transducers, the arrangement of transducers and the order of the transducers attachment to the respective sensor positions of the current module. At start up, the data processing unit queries the current sensor memory to obtain characterization data including error correction factors and relevant specifications that are used by the data processing unit in calculating the meter's output.

Figure 2:
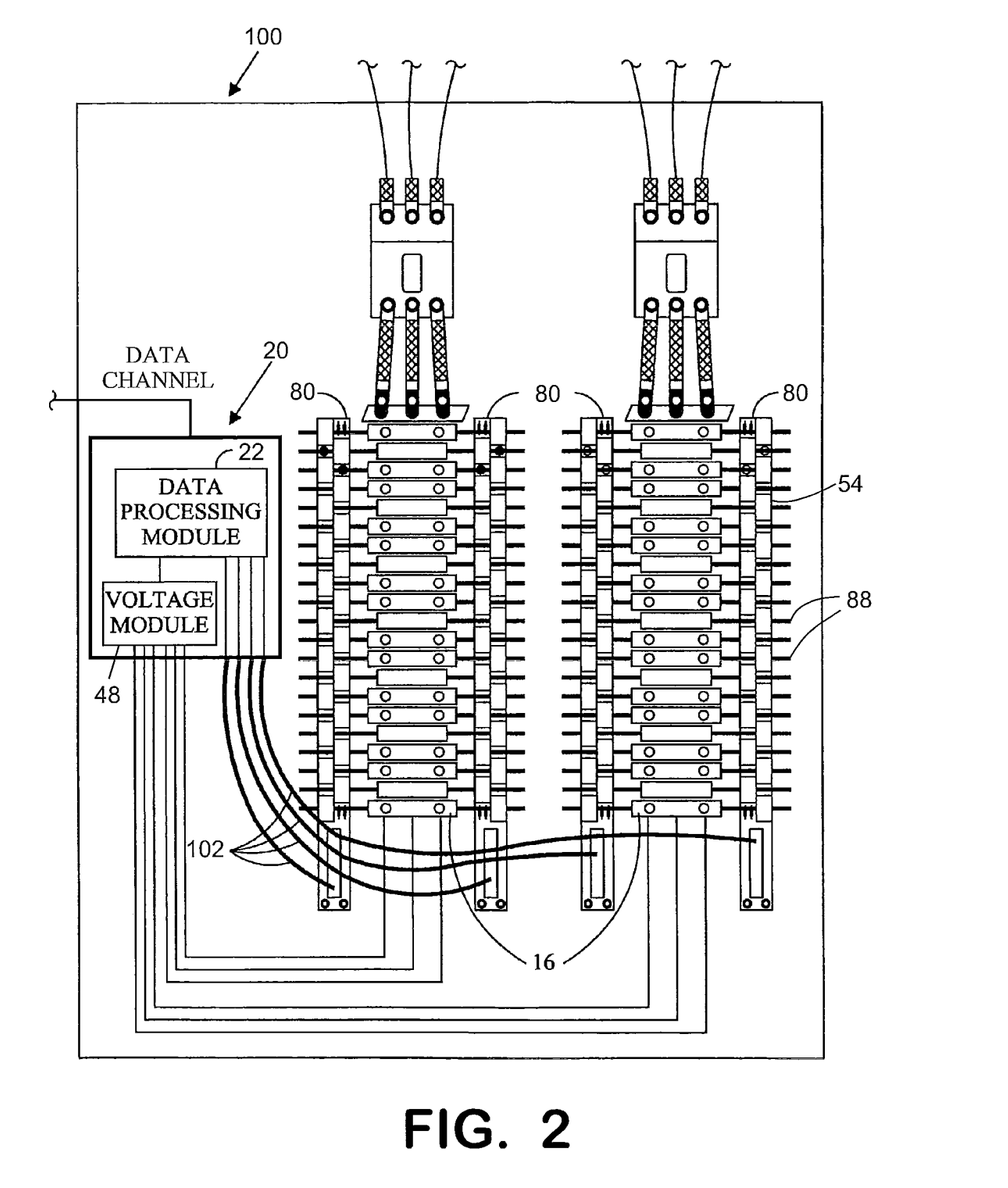
FIG. 2 illustrates a power distribution panel including circuit breakers, a power meter and associated sensors.
Figure 3:
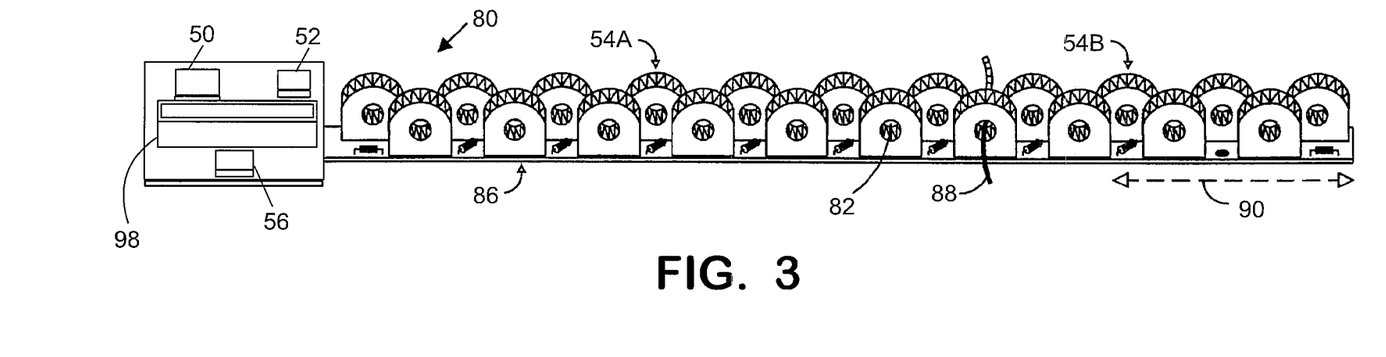
FIG. 3 is a perspective illustration of a plurality of sensors attached to a common support.
Figure 4:
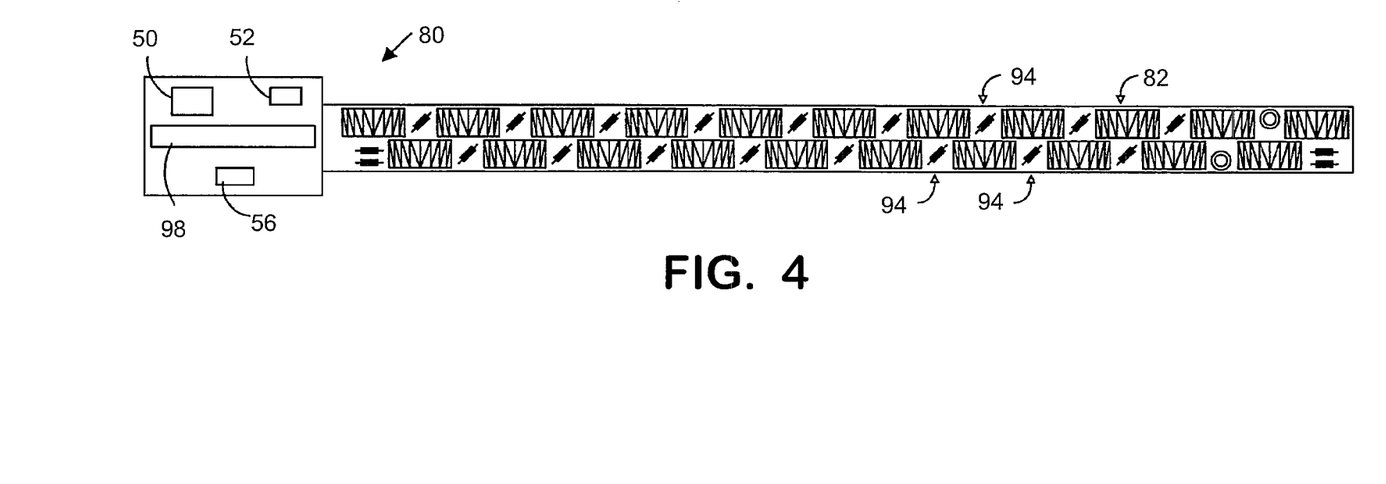
FIG. 4 is a top view of the plurality of sensors of FIG. 3.

Monitoring current in a plurality of branch circuits typically requires a plurality of current transducers, each one encircling one of the plurality of branch power cables that connect the distribution panel to the respective branch circuit. Current sensing may be performed by individual current sensors, such as the current transformer 54D, that are connected to the current module. Referring to FIGS. 2-4, on the other hand, a power meter may comprise one or more sensor strips 80 each comprising a plurality of current sensors attached to a common support, such as sensors 54A, 54B, 54C. The sensors 54 are preferably current transformers but other types of sensors may be used. Each current transformer comprises a coil of wire wound on the cross-section of a toroidal metallic or non-metallic core. The toroidal core is typically enclosed in a plastic housing that includes an aperture 82 enabling a power cable 88 to be extended through the central aperture of the core. The openings 82 defined by the toroidal cores of the transformers are preferably oriented substantially parallel to each other and oriented substantially perpendicular to the longitudinal axis 90 of the support 86. To provide a more compact arrangement of sensors, the sensors 54 may be arranged in substantially parallel rows on the support and the housings of sensors in adjacent rows may be arranged to partially overlap in the direction of the longitudinal axis of the support. To facilitate routing the power cables of the branch circuits through the cores of the current transformers, the common support maintains the current transformers in a fixed spatial relationship that preferably aligns the apertures of the toroidal coils directly opposite the respective connections of the power cables 88 and their respective circuit breakers 16 when the strip is installed in a distribution panel 100. For protection from electrical shock, a transient voltage suppressor 94 may be connected in parallel across the output terminals of each sensor to limit the voltage build up at the terminals when the terminals are open circuited.

The transducer strip 80 may include the current sensor memory 56 containing characterization data for the current transformers mounted on the support 86. The current sensor memory may also include characterization data for the transducer strip enabling the data processing unit to determine whether a transducer strip is compatible with the remainder of the meter and whether the strip is properly connected to the data processing module. Improper connection or installation of an incompatible transducer strip may cause illumination of signaling lights or a warning message on the meter's display. In addition. the transducer strip 80 may comprise a current module of the power meter with one or more current transformers 54, the multiplexer 52, the current sampling unit 50 and the current sensor memory all mounted on the support 86. A connector 98 provides a terminus for a communication link 102 connecting the transducer strip (current module) to the data processing module 22.

The branch current meter also includes one or more errant current alarms to signal an operator or data processing system that manages the facility or one or more operations of an errant current flow in one of the monitored branch circuits. When a current having a magnitude greater or lesser than a respective alarm current limit is detected in one of the branch circuits an alarm annunciator is activated to notify the operator or another data processing system of the errant current flow. An alarm condition may be announced in one or more ways, including, without limitation, periodic or steady illumination of a light 120, sounding of an audible alarm 122, display of a message on the meter's display 32 or transmission of a signal from the communications interface 34 to a remote computer or operator.

Figure 5:
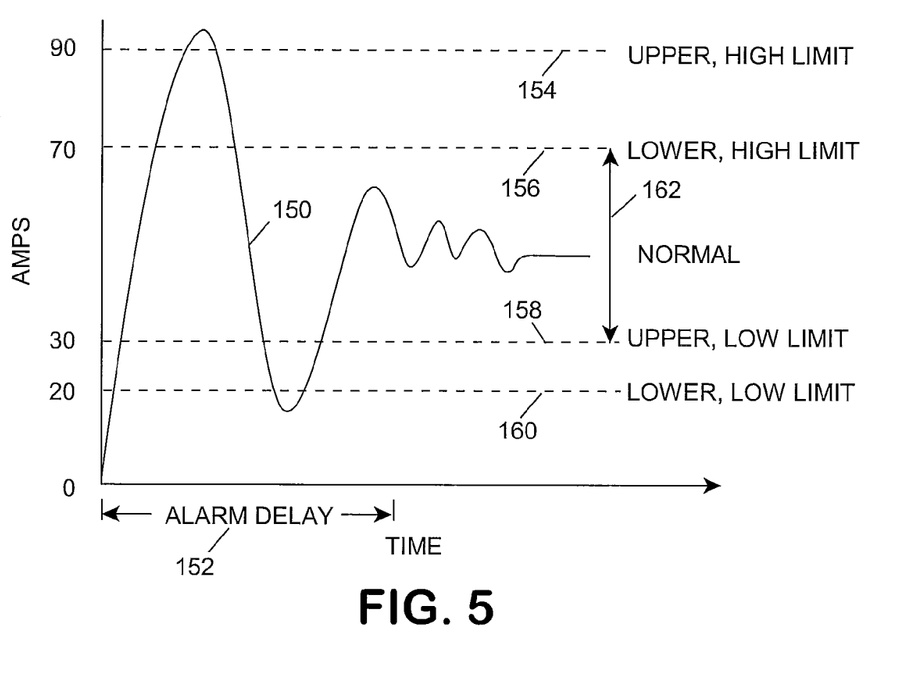
FIG. 5 is a graphic illustration of an exemplary current flowing in a conductor.

The inventors realized that effectiveness of an alarm is substantially degraded by the occurrence of false alarms. Referring to FIG. 5, the inventors further realized that when a circuit is initially energized, the current 150 often fluctuates substantially with transient high and low current spikes resulting from, by way of examples, current inrush into circuit devices having low inductance or under heavy load and contact bounce in the switching device. The inventors concluded that many false alarms could be avoided by delaying activation of the meter's errant current alarm for a period 152 following initial detection of current in the monitored conductor enabling the flow of current in the conductor to stabilize.

Figure 6:
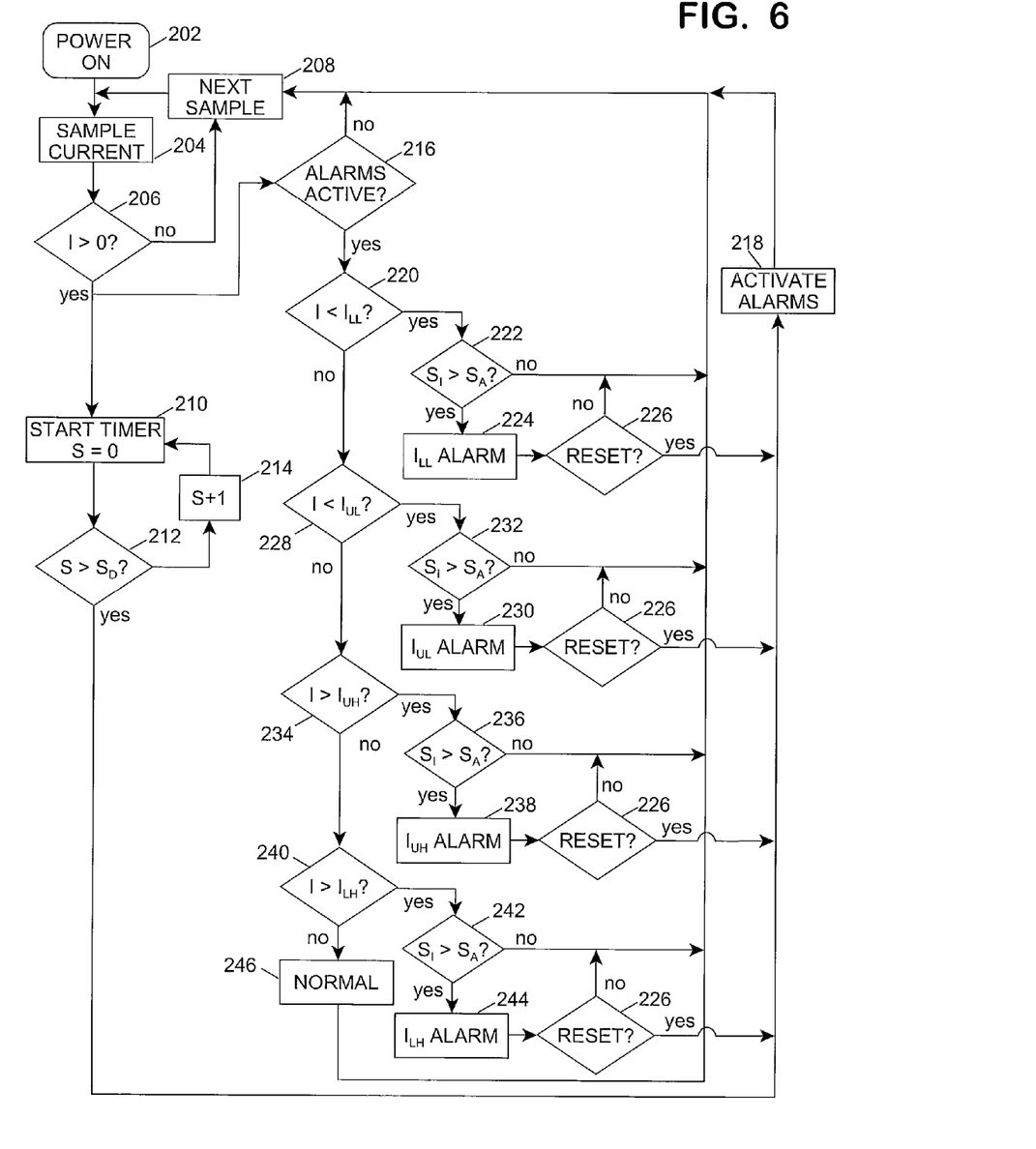
FIG. 6 is flow diagram of a method of current monitoring.

Referring also to FIG. 6, when power is applied to the current monitor 202, the current monitor multiplexer 52, in response to a signal from the clock 40 of the data processing unit 30, sequentially connects the current sampling unit 50 to the respective ones of the current transducers, enabling the sampling unit to sample the respective output of each current transducer 204. From a transducer's output, the data processing unit determines if current is flowing in the conductor monitored by the transducer 206. If the data processing unit does not detect current flowing in the monitored conductor, the sequential sampling of the transducer outputs continues and, in its turn, the sampling unit reads the next sample from the transducer of interest 208.

If, on the other hand, the system determines that a current is flowing in the monitored conductor, the system starts a timer 210 and determines if the errant current alarms have been activated 216. The timer 39 may be a sample counter indexing the count of successive periodic samples 214 until the accumulated number of samples exceeds a number of samples representing an alarm activation delay period ($S_D$) 152. By delaying the activation of the alarm, the likelihood of a false alarm, triggered by transient high or low current spikes, typically accompanying the start up of an electric load, is reduced. When the interval elapsing since the initial detection of current exceeds the alarm activation delay period 212, the alarms are activated 218.

If a sample indicates that a current is flowing in the monitored circuit 206 and the errant current alarm(s) is active 208, the data processing unit compares the magnitude of the current in the conductor to each of a plurality of alarm current limits. The flexibility of the digital meter enables a plurality of alarm current limits to be established for each of the monitored conductors. In the digital meter 20, four alarm current limits are commonly set for each monitored conductor. An upper, high alarm current limit 154 establishes a maximum current for the circuit. Currents greater than the upper, high alarm current limit can damage the devices of the circuit and are typically the result of an electrical short or a very high load. On the other hand, a lower, low alarm current limit 160 establishes a minimum current expected in the circuit and currents less than this limit are likely due to an open circuit, such as opening of an associated circuit breaker. An upper, low current limit 158 provides an indication that the circuit is operating abnormally which may indicate, for example, the loss of a load by a motor or the failure of one of plurality of electrical loads on the monitored circuit. A current transgressing the lower, high alarm current limit 156 indicates an unexpected, but not necessarily damaging, load on the circuit and may portent an impending failure or suggest rebalancing the loads among the plurality of branch circuits served by the distribution panel and monitored by the meter.

If the current in the monitored circuit is less than a lower, low limit ($I_{LL}$) 220, the lower, low limit alarm annunciator will be actuated 224 and will continue to operate until reset 226, reactivating the alarm 218. The alarm may be reset by way of a software instruction to the data processing unit or by a hardware mechanism, such as a switch that momentarily interrupts power to the meter and then restarts the meter 202. An active start of the monitored circuit is indicated by a current in the circuit exceeding the lower, low alarm current limit following alarm activation, whereas current less than the lower, low alarm current limit following alarm activation indicates a failure of the circuit to start operation. A current in the monitored circuit having a magnitude less than the lower, low alarm current limit may also indicate a loss of the circuit's load, for example a broken belt connecting a motor and a fan, or the opening of the circuit, for example an open circuit breaker or switch.

Optionally, a current monitor may include an alarm delay which delays the actuation of an alarm annunciator until an interval has elapsed or a specified number of samples having a greater or lesser magnitude, as appropriate, than the respective alarm current limit have accumulated 222. The delay in actuating the alarm annunciator reduces the likelihood of false alarms resulting from transient current excursions beyond a particular alarm current limit which are not of sufficient duration to produce an effect on the circuit. Different annunciator delay times may be established for each of the alarms. For example, a longer annunciator delay may be established for the upper, low current limit alarm 158 and lower, high current limit alarm 156 than for the lower, low current limit 160 and upper, high current limit 154 alarms.

If the current in the monitored circuit is not less than the lower low alarm current limit 222, the system compares the current to the upper, low alarm current limit 228 and if less than this limit will activate the upper, low limit alarm annunciator 230 after a delay 232. A current less than the upper, low current limit but greater than the lower, low current limit may indicate a problem in the circuit that effects the circuit's performance but does not disrupt conduction in the circuit, such as a reduction in current produced by the failure of single load in a multi-load circuit.

If the current is greater than the upper, low alarm current limit 228, the system compares the current to the upper, high alarm current limit 234 and if the current is greater than this limit will activate the upper, high limit alarm annunciator 238 after a delay 236. A current greater than the upper, high limit 154 indicates a potentially damaging current substantially greater than the nominal current for the circuit which may be the result of a short circuit or a substantial overload. The upper, high alarm annunciator will continue to operate until the alarm is reset 226, reactivating the alarm 218.

If the current is greater than the upper, low alarm current limit 158 and less than the upper, high alarm current limit 154, the system compares the magnitude of the sensed current to a lower, high alarm current limit 204. If the current is greater than this limit, the data processing unit will activate the lower, high limit alarm annunciator 244 after a delay 242. A current greater than the lower, high alarm current limit but less than the upper, high alarm current limit may be not be damaging to the circuit but may be an indication that the circuit is experiencing a sustained high load, for example, a failing motor bearing, and could portent even higher current draws or may indicate an opportunity to rebalance the loads between the plurality of branch circuits served by the distribution panel.

The meter may also include a normal current alarm annunciator which is actuated 246 when the meter's errant current alarms are activated but the magnitude of the current lies between the lower, high alarm current limit and the upper, low alarm current limit.

The power meter monitors the current in a power cable and annunciates an appropriate alarm if the current transgresses one or more of the alarm current limits. False alarms are avoided by delaying activation of the errant current alarms to enable transient currents produced at start up to dissipate. Additionally, a delay in annunciation of an alarm following initial determination of an errant current reduces the likelihood that a transient current spike, coincident with sampling, will produce a false alarm.

The detailed description, above, sets forth numerous specific details to provide a thorough understanding of the present invention. However, those skilled in the art will appreciate that the present invention may be practiced without these specific details. In other instances, well known methods, procedures, components, and circuitry have not been described in detail to avoid obscuring the present invention.

All the references cited herein are incorporated by reference.

The terms and expressions that have been employed in the foregoing specification are used as terms of description and not of limitation, and there is no intention, in the use of such terms and expressions, of excluding equivalents of the features shown and described or portions thereof, it being recognized that the scope of the invention is defined and limited only by the claims that follow.

We claim:

1. A meter for monitoring electric current in a conductor, said meter comprising:
    (a) a timer to transmit a delay signal indicating elapsing of a delay interval following initiation of a flow of current in said conductor;
    (b) a first alarm responsive to detection of a first alarm current having a magnitude less than a first lower limit current, said first alarm responsive to detection of said first alarm current only after transmission of said delay signal;
    (c) a second alarm responsive to detection of a second alarm current having a magnitude less than a second lower limit current and greater than said first lower limit current, said second alarm responsive to detection of said second alarm current only after transmission of said delay signal;
    (d) a third alarm responsive to detection of a third alarm current having a magnitude greater than a first upper limit current, said third alarm responsive to detection of said third alarm current only after transmission of said delay signal; and
    (e) a fourth alarm responsive to detection of a fourth alarm current having a magnitude greater than a second upper limit current and less than said first upper limit current, said fourth alarm responsive to detection of said fourth alarm current only after transmission of said delay signal.

2. The meter for monitoring electric current of claim 1 further comprising an indicator responsive to detection of a current having a magnitude greater than said second lower limit current and less than said second upper limit current, said indicator responsive to detection of current only after transmission of said delay signal.

3. The meter for monitoring electric current of claim 1 further comprising an annunciator to transmit an alarm signal only after a plurality of successive detections of one of said first alarm current, said second alarm current, said third alarm current and said fourth alarm current.

4. A method of monitoring electric current, said method comprising the steps of:
    (a) repeatedly sampling a magnitude of current in a conductor;
    (b) if current is detected in said conductor, determining if an errant current alarm is activated;
    (c) if said errant current alarm is not active, timing an interval from an initial detection of current in said conductor;
    (d) activating said errant current alarm when said interval exceeds a delay interval;
    (e) if said errant current alarm is activated, comparing said magnitude of said detected current to a first alarm current limit;
    (f) if said magnitude of said detected current is less than said first alarm current limit, annunciating a first alarm signal;
    (g) if said errant current alarm is activated, comparing said magnitude of said detected current to said first alarm current limit and a second alarm current limit;
    (h) if said magnitude of said detected current is greater than said first alarm current limit and less than said second alarm current limit, annunciating a second alarm signal;
    (i) if said errant current alarm is activated, comparing said magnitude of said detected current to a third alarm current limit;
    (j) if said magnitude of said detected current is greater than said third alarm current limit, annunciating a third alarm signal;
    (k) if said errant current alarm is activated, comparing said magnitude of said detected current to said third alarm current limit and a fourth alarm current limit; and
    (l) if said magnitude of said detected current is greater than said fourth alarm current limit and less than said third alarm current limit, annunciating a fourth alarm signal.

5. The method of monitoring electric current of claim 4 further comprising the steps of annunciating a fifth alarm signal if said errant current alarm is activated and none of said first alarm signal, said second alarm signal, said third alarm signal and said fourth alarm signal are annunciated.

6. The method of monitoring electric current of claim 4 wherein annunciation of said first alarm signal is initiated after said detected current has transgressed said first alarm current limit for an annunciator delay interval.

7. The method of monitoring electric current of claim 4 wherein annunciation of said third alarm signal is initiated after said detected current has transgressed said third alarm current limit for an annunciator delay interval.

8. The method of monitoring electric current of claim 4 wherein annunciation of said second alarm signal is initiated after said detected current has transgressed said second alarm current limit but not said first alarm current limit for an annunciator delay interval.

9. The method of monitoring electric current of claim 4 wherein annunciation of said fourth alarm signal is initiated after said detected current has transgressed said fourth alarm current limit but not said third alarm current limit for an annunciator delay interval.

* * * * *